(12) United States Patent
Ju

(10) Patent No.: US 7,425,868 B2
(45) Date of Patent: Sep. 16, 2008

(54) APPARATUS AND METHOD FOR CANCELING DC OUTPUT OFFSET

(75) Inventor: Ho-Jung Ju, Seoul (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 134 days.

(21) Appl. No.: 11/357,564

(22) Filed: Feb. 17, 2006

(65) Prior Publication Data

US 2007/0001763 A1 Jan. 4, 2007

(30) Foreign Application Priority Data

Jun. 29, 2005 (KR) .................. 10-2005-0056960

(51) Int. Cl.
*H01F 3/45* (2006.01)

(52) U.S. Cl. .................................. 330/259

(58) Field of Classification Search .................. 330/259
See application file for complete search history.

(56) References Cited

U.S. PATENT DOCUMENTS

| 6,288,604 B1 * | 9/2001 | Shih et al. ................ 330/9 |
|---|---|---|
| 6,522,200 B2 | 2/2003 | Siniscalchi |
| 6,661,286 B2 * | 12/2003 | Filoramo et al. ........... 330/254 |
| 7,193,467 B2 * | 3/2007 | Garlepp et al. ............ 330/259 |
| 2003/0222716 A1 | 12/2003 | Kumeta et al. |

FOREIGN PATENT DOCUMENTS

| EP | 0957578 | 11/1999 |
|---|---|---|
| JP | 10209810 | 8/1998 |
| JP | 10322143 | 12/1998 |
| JP | 20030158427 | 5/2003 |
| KR | 1997-0013821 | 3/1997 |

* cited by examiner

*Primary Examiner*—Robert J. Pascal
*Assistant Examiner*—Alan Wong
(74) *Attorney, Agent, or Firm*—F. Chau & Associates, LLC

(57) ABSTRACT

A transconductor for substantially canceling or reducing a direct current (DC) output offset and a method thereof are provided. The transconductor includes a differential amplifier, a sensing circuit, and a feedback current generation circuit. The differential amplifier outputs output signals having a DC output offset therebetween due to a difference between input signals or a mismatch between input terminals. The sensing circuit senses the DC output offset and outputs a sensing signal. The feedback current generation circuit provides a feedback current for adjusting a level of the output signals to the input stage of the differential amplifier in response to the sensing signal. Accordingly, the transconductor substantially cancels or reduces the DC output offset between the output signals in response to the feedback current.

15 Claims, 6 Drawing Sheets

APPARATUS AND METHOD FOR CANCELING DC OUTPUT OFFSET

CROSS-REFERENCE TO RELATED PATENT APPLICATIONS

This application claims the benefit of Korean Patent Application No. 10-2005-0056960, filed on Jun. 29, 2005, in the Korean Intellectual Property Office, the disclosure of which is incorporated herein by reference.

BACKGROUND OF THE INVENTION

1. Field of the Invention

The present invention relates to a semiconductor circuit, and more particularly, to a transconductor capable of substantially canceling or reducing an output direct current (DC) offset caused by an input DC offset or mismatch between input terminals of the transconductor, and a method thereof.

2. Description of the Related Art

Generally, a DC offset occurring between signals input to a mixer included in a direct conversion transmitter (DCT) greatly affects characteristics such as carrier leakage suppression and image rejection. In particular, since carrier leakage is very sensitive to the DC offset, it greatly degrades adjacent channel power rejection (ACPR) and a maximum output power dynamic range. Accordingly, when the DC offset is substantially canceled, the carrier leakage is reduced.

However, when a capacitor with large capacitance is provided or digital circuit blocks such as an analog-to-digital converter and a digital-to-analog converter are implemented in the DCT to reduce the DC offset, the capacitor and the digital circuit blocks cover a large area and have a large current consumption. Accordingly, use of such capacitors or digital blocks is not appropriate to a trend toward compactness and low power consumption in the communications market.

SUMMARY OF THE INVENTION

The present invention provides an apparatus and method for substantially canceling a direct current (DC) offset occurring between input signals of a mixer while realizing compactness and low power consumption.

According to an aspect of the present invention, a transconductor includes a differential amplifier, a sensing circuit, and a feedback current generation circuit. The differential amplifier amplifies a difference between a first input signal and a second input signal, and outputs a first output voltage and a second output voltage, or a first output current and a second output current, respectively.

The sensing circuit senses a direct current (DC) voltage difference between the first output voltage and the second output voltage and outputs a sensing signal. The feedback current generation circuit generates a feedback current for substantially canceling the DC voltage difference, in response to the sensing signal, and provides the feedback current to the differential amplifier.

In another embodiment of the present invention the first input signal is input to a gate or a base of a first transistor in the differential amplifier and the second input signal is input to a gate or a base of a second transistor in the differential amplifier, and the feedback current is input to at least one of a source or an emitter of the first transistor connected to a first current source supplying a first operating current and a source or an emitter of the second transistor connected to a second current source supplying a second operating current.

The feedback current may include a first feedback current and a second feedback current, and the feedback current generation circuit may include a first feedback current generation circuit providing the first feedback current generated in response to the sensing signal to the source of the first transistor and a second feedback current generation circuit providing the second feedback current generated in response to the sensing signal to the source of the second transistor.

According to another aspect of the present invention, there is provided a transconductor including a first transistor having a gate receiving a first input signal, a first terminal connected to a first current source, and a second terminal, a second transistor having a gate receiving a second input signal, a first terminal connected to a second current source, and a second terminal, a first output voltage generation circuit supplying a first current to the second terminal of the first transistor in response to at least one control signal and outputting a first output voltage related to the first current, a second output voltage generation circuit supplying a second current to the second terminal of the second transistor in response to the at least one control signal and outputting a second output voltage related to the second current, a differential operational amplifier receiving the first output voltage and the second output voltage, amplifying a difference between the first and second output voltages, and outputting the at least one control signal, and a feedback current generation circuit supplying a first and a second feedback current to the first terminal of the first transistor and the first terminal of the second transistor, respectively, to adjust at least one of the first current and the second current. The transconductor may further include a conversion circuit converting the first output voltage and the second output voltage into a first output current and a second output current.

According to still another aspect of the present invention, there is provided a transconductor including a first output terminal of the transconductor outputting a first output voltage, a second output terminal of the transconductor outputting a second output voltage, a first transistor having a gate receiving a first input signal, a first terminal connected to a first current source, and a second terminal; a second transistor having a gate receiving a second input signal, a first terminal connected to a second current source, and a second terminal, a third transistor connected between the first output terminal of the transconductor and the second terminal of the first transistor, the third transistor having a gate receiving a first control signal, a fourth transistor connected between a power supply and the second terminal of the first transistor, the fourth transistor having a gate receiving a second control signal, a fifth transistor connected between the second output terminal of the transconductor and the second terminal of the second transistor, the fifth transistor having a gate receiving the first control signal, a sixth transistor connected between the power supply and the second terminal of the second transistor, the sixth transistor having a gate receiving the second control signal, an operational amplifier having a first input terminal connected to the first output terminal of the transconductor, and a second input terminal connected to the second output terminal of the transconductor, a seventh transistor connected between the power supply and the first terminal of the first transistor, the seventh transistor having a gate connected to a first output terminal of the operation amplifier, and an eighth transistor connected between the power supply and the first terminal of the second transistor, the eighth transistor having a gate connected to a second output terminal of the operation amplifier.

According to yet another aspect of the present invention, there is provided a method of substantially canceling a direct current (DC) offset voltage occurring between a first and a second output terminal of a transconductor. The method includes amplifying a difference between a first and a second input signal input to an input stage of a differential amplifier and outputting a first output voltage and a second output voltage to the first and second output terminals of the transconductor, respectively, sensing the DC offset voltage between the first output voltage and the second output voltage output from the first and second output terminals of the transconductor and outputting a sensing result, generating a feedback current in response to the sensing result and providing the feedback current to the input stage of the differential amplifier, and adjusting one of the first output voltage and the second output voltage in response to the feedback current.

BRIEF DESCRIPTION OF THE DRAWINGS

The above and other features of the present invention will become more apparent by describing exemplary embodiments thereof with reference to the attached drawings in which.

DETAILED DESCRIPTION OF PREFERRED EMBODIMENTS

Figure 1:
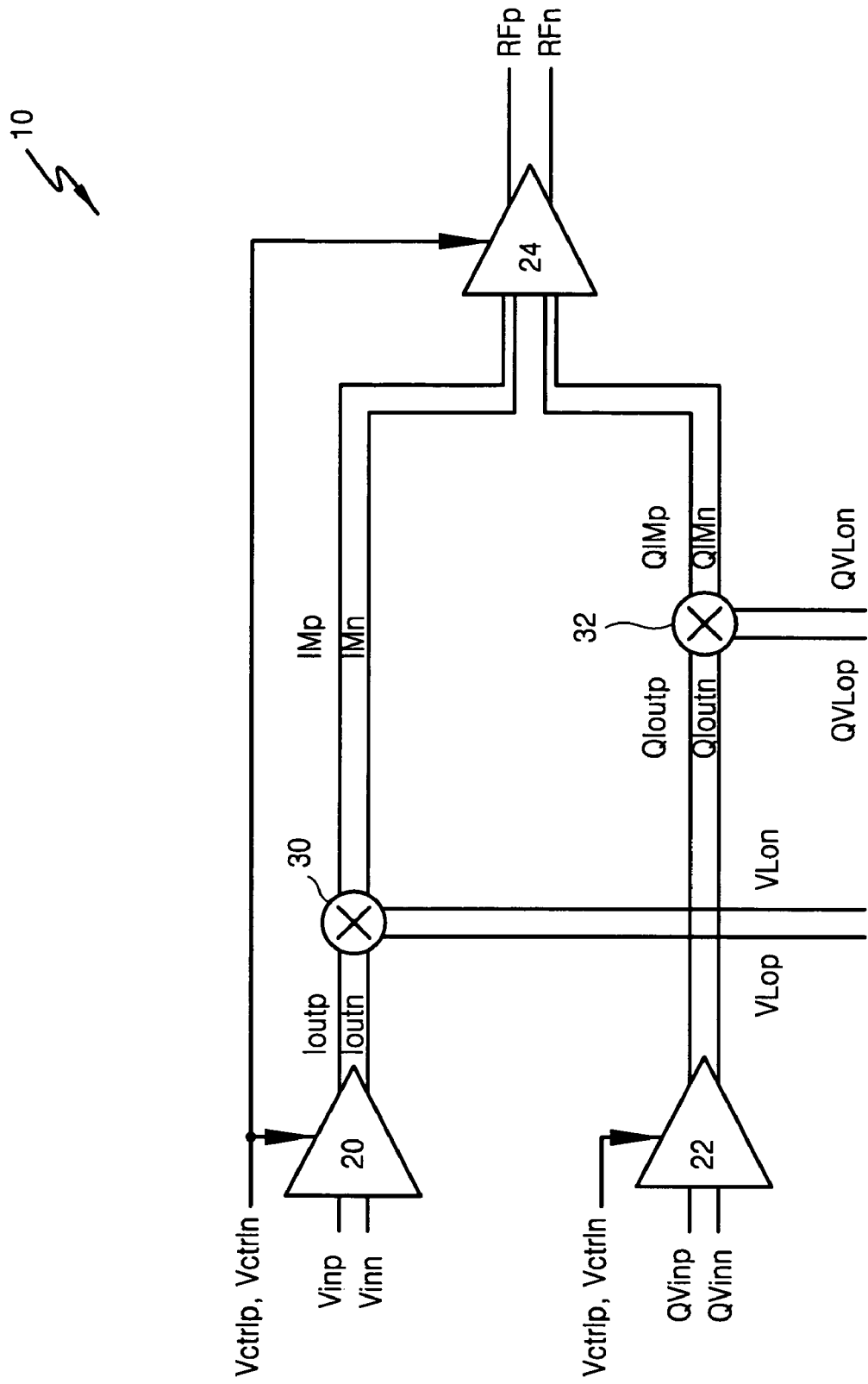
FIG. 1 is a block diagram of a transmitter including transconductors according to an embodiment of the present invention.

The present invention will be described with reference to the attached drawings, wherein like reference numerals refer to like elements throughout.

Figure 2:
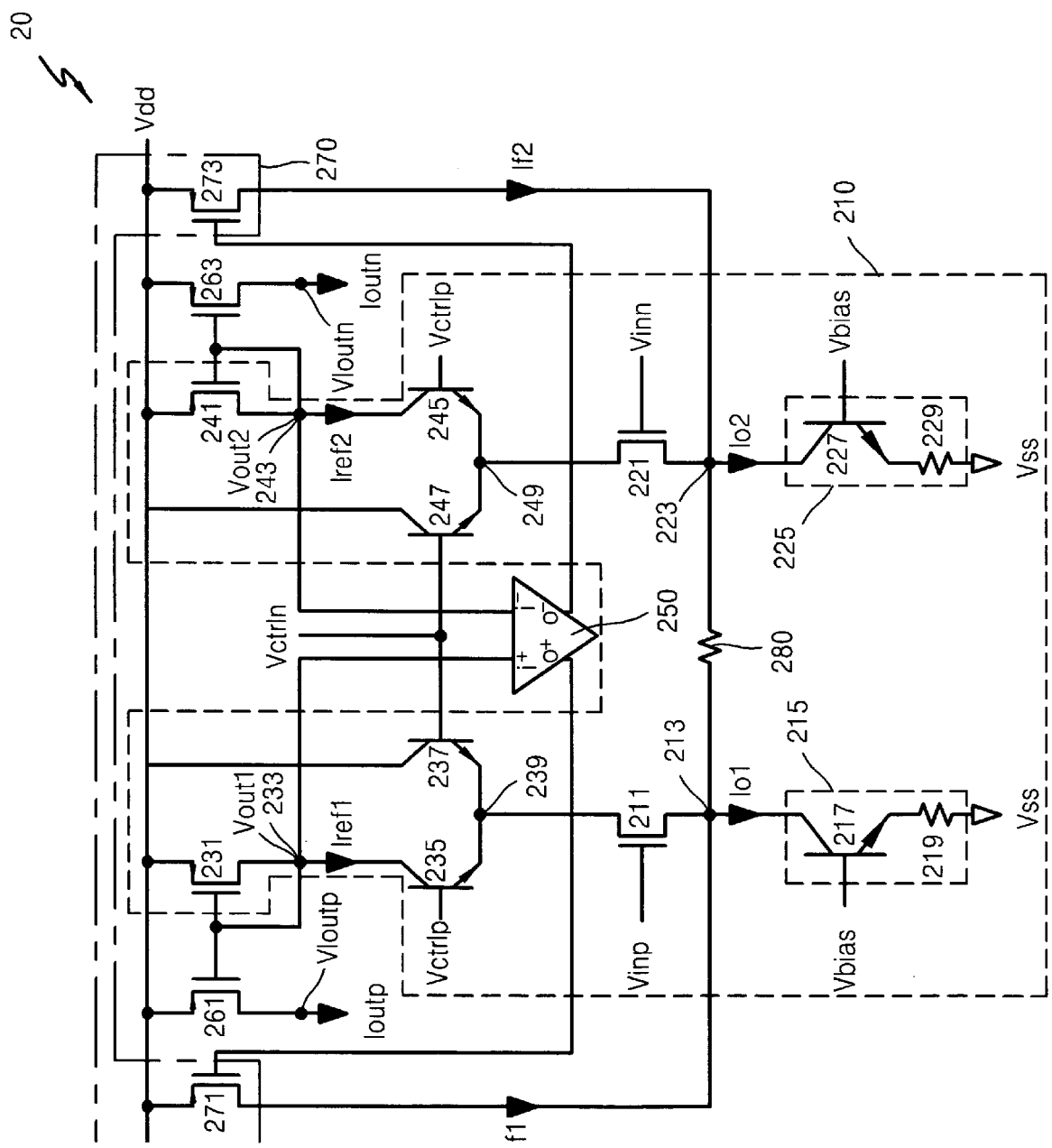
FIG. 2 is a circuit diagram of a transconductor of FIG. 1 according to an embodiment of the present invention.

FIG. 1 is a block diagram of a transmitter including transconductors according to an embodiment of the present invention. The transmitter 10 may be used for wideband code-division multiple access (WCDMA). FIG. 2 is a circuit diagram of a transconductor of FIG. 1 according to an embodiment of the present invention.

Referring to FIGS. 1 and 2, the transmitter 10 includes a plurality of transconductors, for example first and second transconductors 20 and 22, a variable gain amplifier 24, and a plurality of mixers, for example first and second mixers 30 and 32. Each of the first and second transconductors 20 and 22 receives signals output from a modem (not shown) or a baseband low-pass filter (not shown).

The first transconductor 20 is controlled by first and second control signals Vctrlp and Vctrln and outputs variable first and second output currents Ioutp and Ioutn or first and second converted output voltages VIoutp and VIoutn (FIG. 2) to the first mixer 30 in response to first and second input voltages Vinp and Vinn.

The first mixer 30 mixes first and second input carrier signals VLop and VLon with the first and second output currents Ioutp and Ioutn or the first and second converted output voltages VIoutp and VIoutn of the first transconductor 20 and outputs first and second signals IMp and IMn resulting from the mixing to the variable gain amplifier 24. Each of the first and second input carrier signals VLop and VLon is used as a switching signal for the first mixer 30.

When mixing voltages with carrier signals, the first mixer 30 receives a first output voltage Vout1 or the first converted output voltage VIoutp and a second output voltage Vout2 or the converted output voltage VIoutn from the first transconductor 20. In addition, when mixing currents with carrier signals, the first mixer 30 receives the first output current Ioutp and the second output current Ioutn from the first transconductor 20.

The second transconductor 22 is controlled by the first and second control signals Vctrlp and Vctrln and outputs variable third and fourth output currents QIoutp and QIoutn to the second mixer 32 in response to third and fourth input voltages QVinp and QVinn.

The second mixer 32 mixes third and fourth input carrier signals QVLop and QVLon with the third and fourth output currents QIoutp and QIoutn of the second transconductor 22 and outputs third and fourth signals QIMp and QIMn resulting from the mixing to the variable gain amplifier 24. Each of the third and fourth input carrier signals QVLop and QVLon is used as a switching signal for the second mixer 32.

Here, it is preferable that a phase difference between the first and second input voltages Vinp and Vinn and the respective third and fourth input voltages QVinp and QVinn, a phase difference between the first and second output currents Ioutp and Ioutn and the respective third and fourth output currents QIoutp and QIoutn, and a phase difference between the first and second input carrier signals VLop and VLon of the first mixer 30 and the respective third and fourth input carrier signals QVLop and QVLon of the second mixer 32, are 90°, but is not restricted thereto.

The variable gain amplifier 24 receives first and second signals IMp and IMn from the first mixer 30 and third and fourth signals QIMp and QIMn from the second mixer 32 and combines the first and second signals IMp and IMn with the third and fourth signals QIMp and QIMn, respectively, or combines the first and second signals IMp and IMn with the fourth and third signals QIMn and QIMp, respectively. Thereafter, the variable gain amplifier 24 adjusts a gain according to the first and second control signals Vctrlp and Vctrln and outputs first and second radio frequency signals RFp and RFn.

The variable gain amplifier 24 may have a first combined signal, in which the first signal IMp is combined with the third signal QIMp, as a first combined input signal and a second combined signal, in which the second signal IMn is combined with the fourth signal QIMn, as a second combined input signal. Alternatively, the variable gain amplifier 24 may have a first combined signal, in which the first signal IMp is combined with the fourth signal QIMn, as the first combined input signal and a second combined signal, in which the second signal IMn is combined with the third signal QIMp, as the second combined input signal, but is not restricted thereto.

Each of the first and second transconductors 20 and 22 has a structure as illustrated in FIG. 2. Hereinafter, the structure and operations of the first transconductor 20 will be described.

Referring to FIG. 2, the first transconductor 20 has a structure for substantially canceling a direct current (DC) output voltage difference, i.e., a DC output offset, between the first output voltage Vout1 or the first converted output voltage VIoutp and the second output voltage Vout2 or the second converted output voltage VIoutn. The first transconductor 20 includes a differential amplifier 210, a sensing circuit 250, and a feedback current generation circuit 270.

In response to the control signals Vctrlp and Vctrln, the differential amplifier 210 amplifies a difference between the first input voltage Vinp and the second input voltage Vinn and outputs the first and second output voltages Vout1 and Vout2 according to the amplification result and/or the first and second output currents Ioutp and Ioutn respectively.

The first transconductor 20 may output the first output voltage Vout1 and the second output voltage Vout2 when the first mixer 30 mixes voltages and may output the first output current Ioutp and the second output current Ioutn when the first mixer 30 mixes currents.

A first resistance element 231 is connected between a power supply voltage Vdd (or internal power supply voltage Vcc) and a first output terminal 233, which outputs the first output voltage Vout1. The first resistance element 231 may be implemented with a transistor, which is connected between the power supply voltage Vdd and the first output terminal 233. A gate of the transistor for the first resistance element 231 is connected to the first output terminal 233.

A second resistance element 241 is connected between the power supply voltage Vdd and a second output terminal 243, which outputs the second output voltage Vout2. The second resistance element 241 may be implemented with a transistor, which is connected between the power supply voltage Vdd and the second output terminal 243. A gate of the transistor for the second resistance element 241 is connected to the second output terminal 243.

A first transistor 211 is used as a voltage-current conversion circuit and has a gate receiving the first input voltage Vinp, a first terminal connected to a second node 213 which connects to a first current source 215, and a second terminal connected to a first node 239. The first current source 215 includes a first current source transistor 217 and a first current source resistor 219, which are connected in series between the second node 213 and a ground Vss, and allows a first constant current 101 to flow in response to a bias voltage Vbias.

A second transistor 221 is also used as a voltage-current conversion circuit and has a gate receiving the second input voltage Vinn, a first terminal connected to a fourth node 223 which connects to a second current source 225, and a second terminal connected to a third node 249. The second current source 225 includes a second current source transistor 227 and a second current source resistor 229, which are connected in series between the fourth node 223 and the ground Vss, and allows a second constant current Io2 to flow in response to the bias voltage Vbias. The first input voltage Vinp and the second input voltage Vinn may be differential signals or complementary signals.

A third transistor 235 is connected between the first output terminal 233 and the first node 239 (second terminal of the first transistor 211) and has a gate receiving the first control signal Vctrlp. A fourth transistor 237 is connected between the power supply voltage Vdd and the first node 239 (second terminal of the first transistor 211) and has a gate receiving the second control signal Vctrln. The third and fourth transistors 235 and 237 have emitters connected with each other, and they switch in response to the first and second control signals Vctrlp and Vctrln, respectively.

A fifth transistor 245 is connected between the second output terminal 243 and the third node 249 (second terminal of the second transistor 221) and has a gate receiving the first control signal Vctrlp. A sixth transistor 247 is connected between the power supply voltage Vdd and the third node 249 (second terminal of the second transistor 221) and has a gate receiving the second control signal Vctrln. The fifth and sixth transistors 245 and 247 have emitters connected with each other, and they switch in response to the first and second control signals Vctrlp and Vctrln, respectively.

The sensing circuit 250 senses a DC voltage difference (i.e., a DC output offset) between the first output voltage Vout1 and the second output voltage Vout2 and outputs to the feedback current generation circuit 270 at least one sensing signal, and preferably, complementary control signals according to the sensing result.

The sensing circuit 250 may be implemented as a differential operational amplifier which has a first input terminal (i+) connected to the first output terminal 233, a second input terminal (i−) connected to the second output terminal 243, a first output terminal (o+), and a second output terminal (o−), but is not restricted thereto.

The feedback current generation circuit 270 includes a first feedback current generation circuit and a second feedback current generation circuit. In response to the corresponding sensing signals output from the sensing circuit 250, the feedback current generation circuit 270 generates first and second feedback currents If1 and If2 for substantially canceling the DC voltage difference, and respectively provides the first and second feedback currents If1 and If2 to the sources of the respective first and second transistors 211 and 221, constituting input terminals of the differential amplifier 210.

A seventh transistor 271 is used as the first feedback current generation circuit. The seventh transistor 271 is connected between the power supply voltage Vdd and the second node 213 and supplies the first feedback current If1 to the second terminal of the first transistor 211 in response to the sensing signal output from the first output terminal (o+) of the sensing circuit 250.

An eighth transistor 273 is used as the second feedback current generation circuit. The eighth transistor 273 is connected between the power supply voltage Vdd and the fourth node 223 and supplies the second feedback current If2 to the second terminal of the second transistor 221 in response to the sensing signal output from the second output terminal (o−) of the sensing circuit 250. Each of the seventh and eighth transistors 271 and 273 may be implemented as pMOS transistors.

The first transconductor 20 further includes first and second conversion circuits 261 and 263 implemented with transistors to convert the first output voltage Vout1 and the second output voltage Vout2 into the first output current Ioutp and the second output current Ioutn, resulting in the first converted output voltage VIoutp and the second converted output voltage VIoutn, respectively.

The transistors for the first resistance element and the first conversion circuit 231 and 261 form a current mirror and the transistors for the second resistance element and the second conversion circuit 241 and 263 form another current mirror. A resistor 280 is connected between the second and fourth nodes 213 and 223.

A maximum transconductance Gm of the first transconductor 20 according to this embodiment of the present invention is determined by Equation (1):

$$\frac{(Ioutp - Ioutn)}{(Vinp - Vinn)} = Gm = m * \frac{gm}{(2 + gmRd)}, \quad (1)$$

where gm is a transconductance of the first transistor 211, Rd is a resistance of the resistor 280, and "m" is a length-to-width ratio of the transistors for the first resistance element and the first conversion circuit 231 and 261, respectively.

The following briefly describes the operation of the first transconductor 20 with reference to FIGS. 1 and 2.

When a DC input offset is present between the first input voltage Vinp and the second input voltage Vinn or when an offset occurs due to a mismatch between the first transistor 211 and the second transistor 221, a DC output offset occurs between the first output voltage Vout1 or the first converted output voltage VIoutp and the second output voltage Vout2 or the second converted output voltage VIoutn.

For example, when the voltage level of the first control signal Vctrlp is higher than that of the second control signal Vctrln and the first output voltage Vout1 is higher than the second output voltage Vout2, the first output terminal (o+) of the sensing circuit 250 outputs a high level voltage and the second output terminal (o−) of the sensing circuit 250 outputs a low level voltage. Accordingly, the seventh transistor 271 decreases the first feedback current If1 flowing to the second node 213 and the eighth transistor 273 increases the second feedback current If2 flowing to the fourth node 223.

Here, since the second constant current Io2 flowing in the second current source 225 is constant, when the second feedback current If2 supplied to the fourth node 223 increases, a second current Iref2 flowing in the drain of the fifth transistor 245 decreases and the second output voltage Vout2 of the second output terminal 243 increases. Contrarily, since the first constant current Io1 flowing in the first current source 215 is constant, when the first feedback current If1 supplied to the second node 213 decreases, a first current Iref1 flowing in the drain of the third transistor 235 increases and the first output voltage Vout1 of the first output terminal 233 decreases. The decrease of the first output voltage Vout1 and the increase of the second output voltage Vout2 are continued until the first output voltage Vout1 and the second output voltage Vout2 become equal.

However, when the voltage level of the first control signal Vctrlp is higher than that of the second control signal Vctrln and when the first output voltage Vout1 is lower than the second output voltage Vout2, the first output terminal (o+) of the sensing circuit 250 outputs a low level voltage and the second output terminal (o−) of the sensing circuit 250 outputs a high level voltage. Accordingly, the seventh transistor 271 increases the first feedback current If1 flowing to the second node 213 and the eighth transistor 273 decreases the second feedback current If2 flowing to the fourth node 223.

Here, since the first constant current Io1 flowing in the first current source 215 is constant, when the first feedback current If1 supplied to the second node 213 increases, the first current Iref1 flowing in the drain of the third transistor 235 decreases and the first output voltage Vout1 of the first output terminal 233 increases. Contrarily, since the second constant current Io2 flowing in the second current source 225 is constant, when the second feedback current If2 supplied to the fourth node 223 decreases, the second current Iref2 flowing in the drain of the fifth transistor 245 increases and the second output voltage Vout2 of the second output terminal 243 decreases. The increase of the first output voltage Vout1 and the decrease of the second output voltage Vout2 are continued until the first output voltage Vout1 and the second output voltage Vout2 become equal.

In other words, at least one of the first output voltage Vout1 or the first converted output voltage VIoutp, the second output voltage Vout2 or the second converted output voltage VIoutn, the first output current Ioutp related to the first output voltage Vout1, and the second output current Ioutn related to the second output voltage Vout2 is adjusted based on the corresponding first and/or second feedback current If1 and/or If2.

When the first output voltage Vout1 is equal to the second output voltage Vout2, the first feedback current If1 is equal to the second feedback current If2.

The sensing circuit 250 of the first transconductor 20 senses a voltage difference between the DC output voltages of the respective first and second output terminals 233 and 243. The feedback current generation circuit 270 supplies the first and second feedback currents If1 and If2 based on the sensing result of the sensing circuit 250 so that the voltage difference is substantially canceled.

Figure 3A:
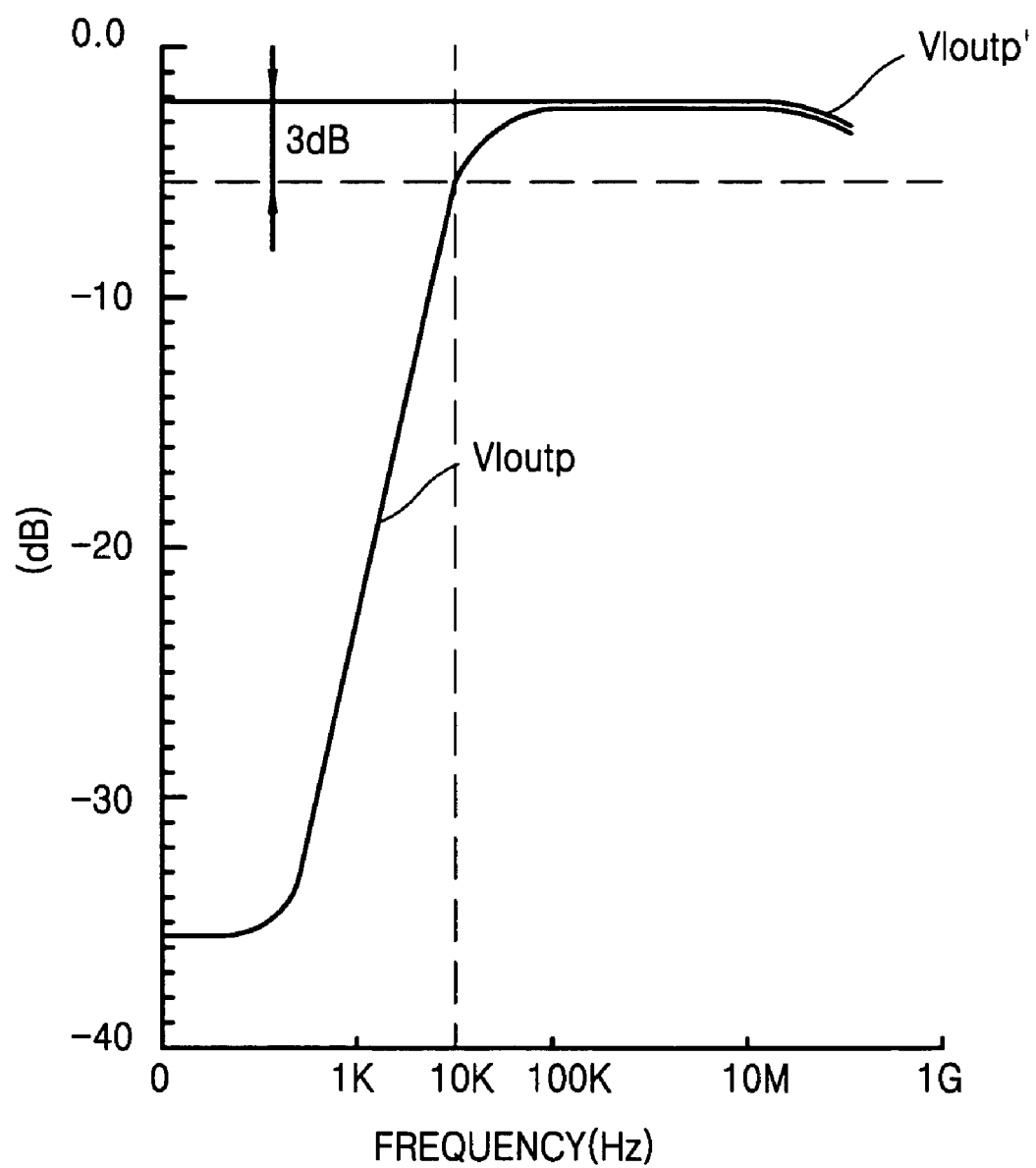
FIG. 3A illustrates an alternating current output voltage response when an input direct current offset does not exist.
Figure 3B:
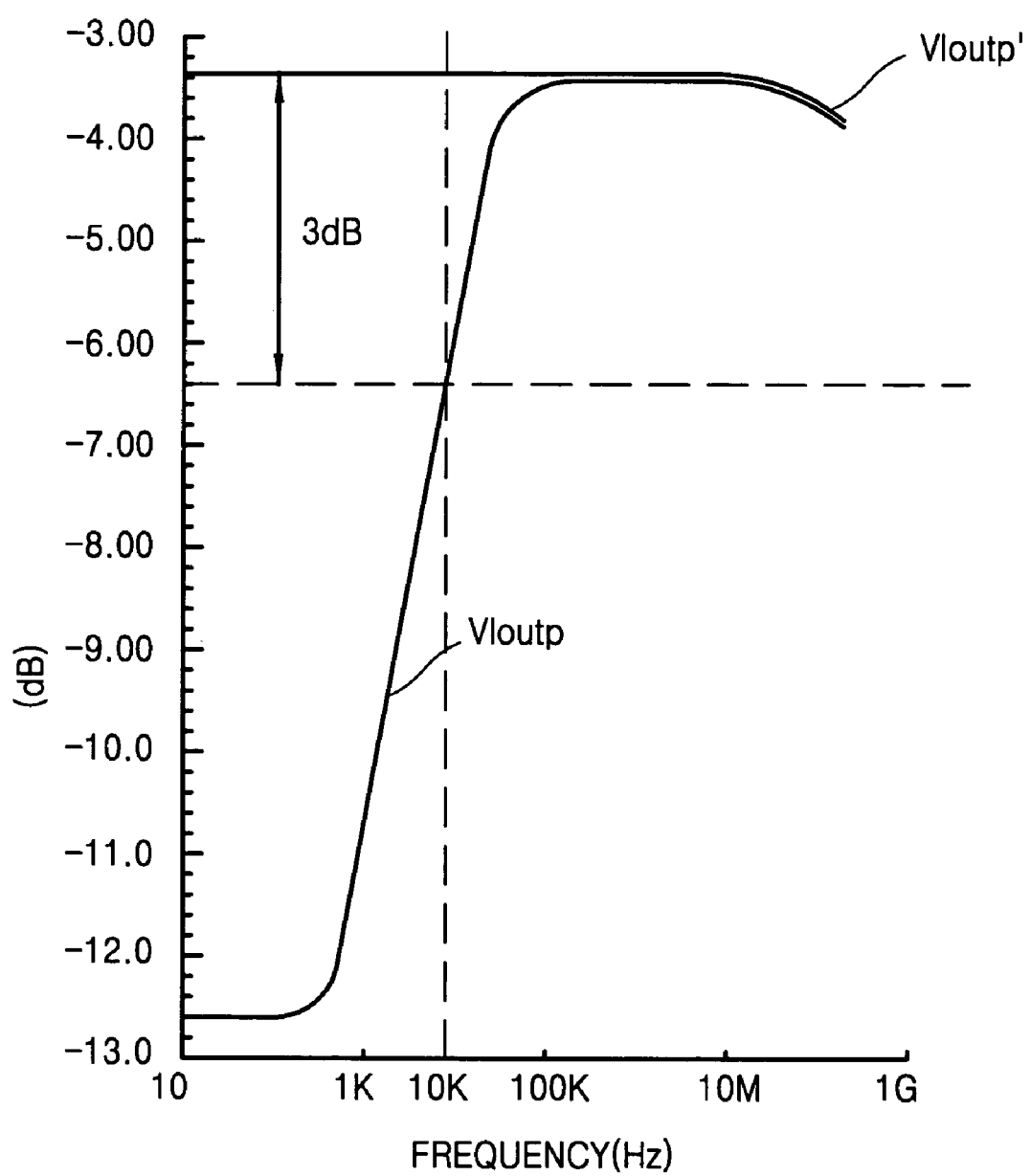
FIG. 3B illustrates an alternating current output voltage response when an input direct current offset is present.

FIG. 3A illustrates an alternating current output voltage response when an input direct current offset does not exist. FIG. 3B illustrates an alternating current output voltage response when an input direct current offset is present. For example, in FIG. 3B the input direct current offset is 10 mV.

Referring to FIGS. 2 through 3B, the first converted output voltage VIoutp' shows a voltage of the drain of the transistor for the first conversion circuit 261 when the sensing circuit 250 and the feedback current generation circuit 270 are not provided and the first converted output voltage VIoutp shows the voltage of the transistor for the first conversion circuits 261 included in a transconductor according to an embodiment of the present invention.

Referring to FIGS. 3A and 3B, the 3 dB-cutoff frequency of a transfer function of the input voltages and the output voltages of a transconductor according to an embodiment of the present invention does not exceed 10 KHz. It takes at least 50 μs to realize a 3 dB-cutoff frequency of 10 KHz or less by substantially canceling or reducing a direct current (DC) output offset. Typically, it takes at least 100 μs until data will be input to a wideband code-division multiple access (WCDMA) transmitter after the WCDMA transmitter is turned ON. Therefore, the time to substantially cancel or reduce the DC output offset is not significant. In addition, the transconductor according to an embodiment of the present invention has a small current consumption of about 100 μA or less.

Figure 4A:
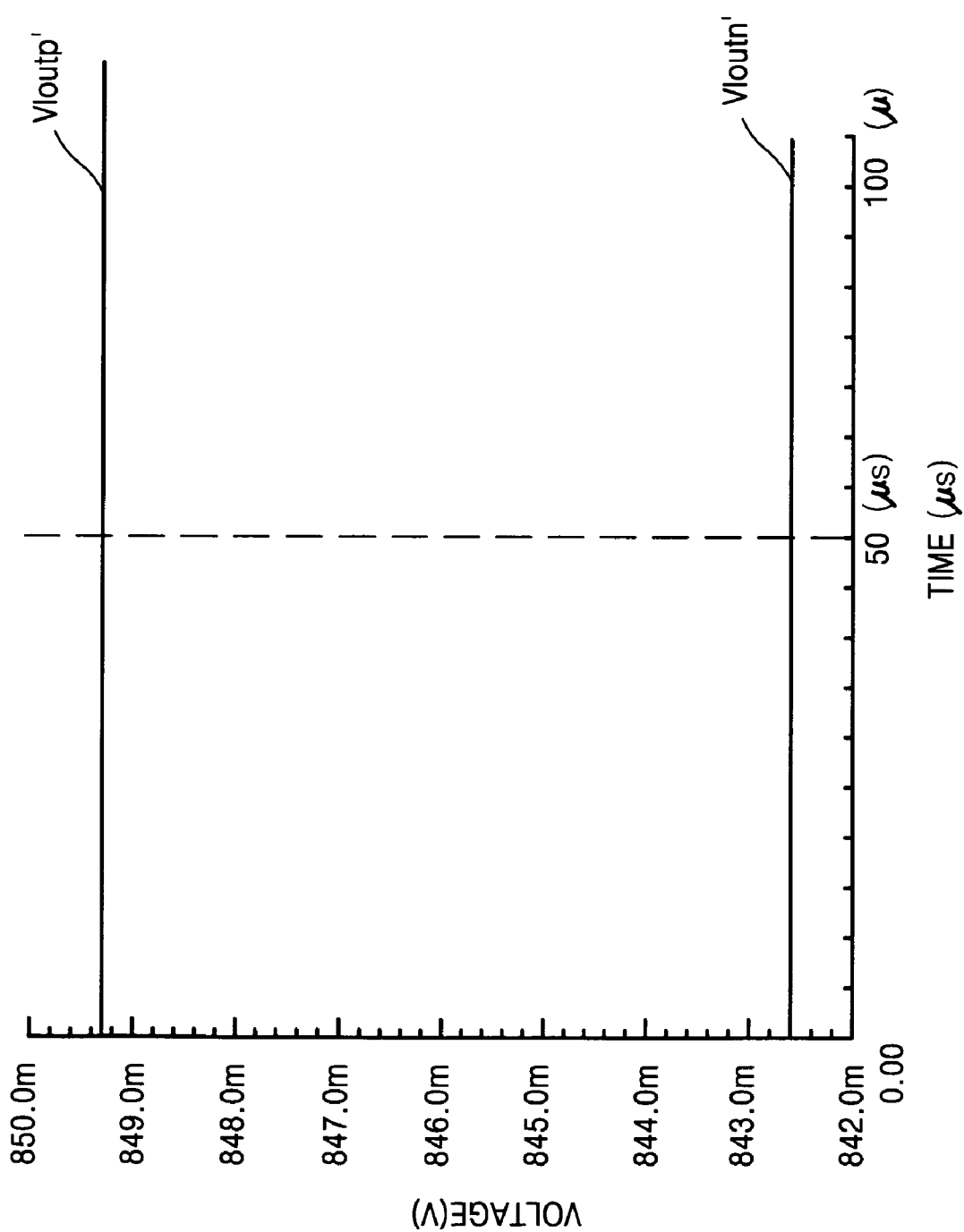
FIG. 4A illustrates a waveform of a transient direct current output voltage of a transconductor, without the sensing circuit and the feedback current generation circuit of FIG. 1 and FIG. 2, and with an input direct current offset.
Figure 4B:
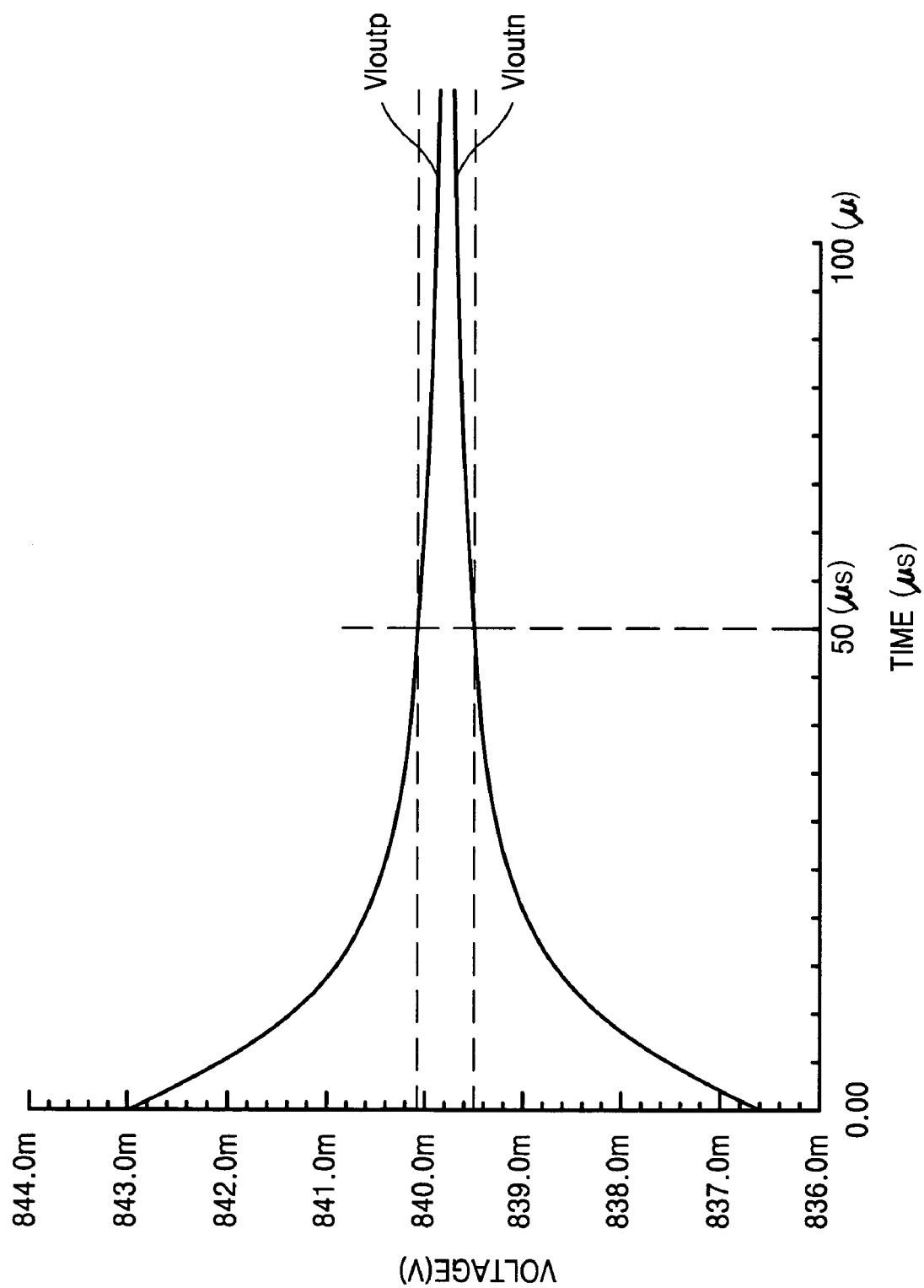
FIG. 4B illustrates a waveform of a transient direct current output voltage of the transconductor according to the embodiment illustrated in FIG. 1 and FIG. 2, with an input direct current offset.

FIG. 4A illustrates a waveform of a transient direct current output voltage of a transconductor, without the sensing circuit and the feedback current generation circuit of FIG. 1 and FIG. 2, and with an input direct current offset. FIG. 4B illustrates a waveform of a transient direct current output voltage of the transconductor of FIG. 1 and FIG. 2, with an input DC offset. For example, in FIG. 4A and FIG. 4B the input direct current offset is 10 mV.

When a DC input offset voltage of 10 mV is present between the first and second input voltages Vinp and Vinn, a DC output offset voltage between the first and second converted output voltages VIoutp' and VIoutn' is constant even after time elapses, as shown in FIG. 4A. However, as shown in FIG. 4B, a DC output offset voltage between the first and second converted output voltages VIoutp and VIoutn of the transistors for the first and second conversion circuits 261 and 263 included in the first transconductor 20 according to an embodiment of the present invention decreases when time elapses.

An embodiment of the present invention to substantially cancel a DC offset voltage occurring between the first and second output terminals 233 and 243 included in the first transconductor 20 includes a method where the first transconductor 20 amplifies a difference between the first and second input voltages Vinp and Vinn, which have been input to the input terminals of the differential amplifier 210, in response to the first and second control signals Vctrlp and Vctrln, outputs the first output voltage Vout1 and the second output voltage Vout2 to the first and second output terminals 233 and 243, respectively, according to the amplification result, senses the DC offset voltage between the first and second output voltages Vout1 and Vout2 output from the respective first and second output terminals 233 and 243, outputs a sensing result, generates the first and second feedback currents If1 and If2 in response to the sensing result, respectively provides the first and second feedback currents If1 and If2 to the input terminals of the differential amplifier 210, and adjusts one of the first and second output voltages Vout1 and Vout2 in response to the first and second feedback currents If1 and If2, thereby substantially canceling the DC offset voltage. It is preferable that the first output voltage Vout1 and the second output voltage Vout2 are complementarily adjusted.

According to an embodiment of the present invention, a transconductor substantially cancels or reduces a DC output offset occurring due to an offset between input signals or a mismatch between input terminals of the transconductor. Accordingly, the transconductor according to an embodiment of the present invention enhances the characteristic of carrier leakage suppression.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A transconductor comprising:
   a differential amplifier amplifying a difference between a first input signal and a second input signal, and outputting a first output voltage and a second output voltage, respectively, wherein the differential amplifier amplifies the difference between the first input signal and the second input signal in response to a first and second control signal;
   a sensing circuit sensing a direct current (DC) voltage difference between the first output voltage and the second output voltage and outputting a sensing signal; and
   a feedback current generation circuit generating a feedback current for substantially canceling the DC voltage difference, in response to the sensing signal, and providing the feedback current to the differential amplifier.

2. The transconductor of claim 1, wherein the first input signal is input to a gate of a first transistor in the differential amplifier and the second input signal is input to a gate of a second transistor in the differential amplifier, and the feedback current is input to at least one of a source of the first transistor connected to a first current source supplying a first operating current and a source of the second transistor connected to a second current source supplying a second operating current.

3. The transconductor of claim 1, wherein the first input signal is input to a base of a first transistor in the differential amplifier and the second input signal is input to a base of a second transistor in the differential amplifier, and the feedback current is input to at least one of an emitter of the first transistor connected to a first current source supplying a first operating current and an emitter of the second transistor connected to a second current source supplying a second operating current.

4. The transconductor of claim 2, wherein the feedback current comprises a first feedback current and a second feedback current, and the feedback current generation circuit comprises a first feedback current generation circuit providing the first feedback current generated to the source of the first transistor, and a second feedback current generation circuit providing the second feedback current generated to the source of the second transistor.

5. A transconductor comprising:
   a differential amplifier amplifying a difference between a first input voltage and a second input voltage, which have been input through an input stage and outputting a first output voltage and a second output voltage through a first output terminal and a second output terminal, respectively, wherein the differential amplifier amplifies the difference between the first input signal and the second input signal in response to a first and second control signal;
   a sensing circuit sensing a direct current (DC) voltage difference between the first output voltage and the second output voltage, amplifying the DC voltage difference, and outputting at least one sensing signal; and
   a feedback current generation circuit generating at least one feedback current for substantially canceling the DC voltage difference by adjusting at least one of the first output voltage and the second output voltage in response to the at least one sensing signal, and providing the at least one feedback current to the input stage of the differential amplifier.

6. A transconductor comprising:
   a differential amplifier amplifying a difference between a first input voltage and a second input voltage, which have been input through an input stage and outputting a first output voltage and a second output voltage through a first output terminal and a second output terminal, respectively
   a sensing circuit sensing a direct current (DC) voltage difference between the first output voltage and the second output voltage, amplifying the DC voltage difference, and outputting at least one sensing signal;
   a feedback current generation circuit generating at least one feedback current for substantially canceling the DC voltage difference by adjusting at least one of the first output voltage and the second output voltage in response to the at least one sensing signal, and providing the at least one feedback current to the input stage of the differential amplifier; and
   a conversion circuit converting the first output voltage and the second output voltage into a first output current and a second output current, respectively.

7. The transconductor of claim 6, wherein the first input voltage and the second input voltage are output from one of a modem and a filter, and the first output voltage and the second output voltage or the first output current and the second output current are output to a mixer.

8. A transconductor comprising:
   a differential amplifier amplifying a difference between a first input voltage and a second input voltage, which have been input through an input stage and outputting a first output voltage and a second output voltage through a first output terminal and a second output terminal, respectively;
   a sensing circuit sensing a direct current (DC) voltage difference between the first output voltage and the second output voltage, amplifying the DC voltage difference, and outputting at least one sensing signal; and
   a feedback current generation circuit generating at least one feedback current for substantially canceling the DC voltage difference by adjusting at least one of the first output voltage and the second output voltage in response to the at least one sensing signal, and
   providing the at least one feedback current to the input stage of the differential amplifier, wherein the differential amplifier comprises:

a first output voltage generation circuit connected between a power supply and a first node to output the first output voltage through the first output terminal;

a second output voltage generation circuit connected between the power supply and a second node to output the second output voltage through the second output terminal;

a first transistor in the input stage having a gate receiving the first input voltage, a first terminal connected to a first current source, and a second terminal connected to the first node; and a second transistor in the input stage having a gate receiving the second input voltage, a first terminal connected to a second current source, and a second terminal connected to the second node, wherein the at least one feedback current is input corresponding to one of the first terminal of the first transistor and the first terminal of the second transistor.

9. The transconductor of claim 8, wherein the at least one feedback current comprises a first feedback current and a second feedback current, and the feedback current generation circuit comprises a first feedback current generation circuit providing the first feedback current generated in response to the sensing signal to the first terminal of the first transistor and a second feedback current generation circuit providing the second feedback current generated in response to the sensing signal to the first terminal of the second transistor.

10. A transconductor comprising:
a first transistor having a gate receiving a first input signal, a first terminal connected to a first current source, and a second terminal;

a second transistor having a gate receiving a second input signal, a first terminal connected to a second current source, and a second terminal;

a first output voltage generation circuit supplying a first current to the second terminal of the first transistor in response to at least one control signal and outputting a first output voltage related to the first current;

a second output voltage generation circuit supplying a second current to the second terminal of the second transistor in response to the at least one control signal and outputting a second output voltage related to the second current;

a differential operational amplifier receiving the first output voltage and the second output voltage, amplifying a difference between the first and second output voltages, and outputting the at least one control signal; and a feedback current generation circuit supplying a first and a second feedback current to the first terminal of the first transistor and the first terminal of the second transistor, respectively, to adjust at least one of the first current and the second current.

11. The transconductor of claim 10, further comprising a conversion circuit converting the first output voltage and the second output voltage into a first output current and a second output current, respectively.

12. A transconductor comprising:
a first output terminal of the transconductor outputting a first output voltage;

a second output terminal of the transconductor outputting a second output voltage;

a first transistor having a gate receiving a first input signal, a first terminal connected to a first current source, and a second terminal;

a second transistor having a gate receiving a second input signal, a first terminal connected to a second current source, and a second terminal;

a third transistor connected between the first output terminal of the transconductor and the second terminal of the first transistor, the third transistor having a gate receiving a first control signal;

a fourth transistor connected between a power supply and the second terminal of the first transistor, the fourth transistor having a gate receiving a second control signal;

a fifth transistor connected between the second output terminal of the transconductor and the second terminal of the second transistor, the fifth transistor having a gate receiving the first control signal;

a sixth transistor connected between the power supply and the second terminal of the second transistor, the sixth transistor having a gate receiving the second control signal;

an operational amplifier having a first input terminal connected to the first output terminal of the transconductor, and a second input terminal connected to the second output terminal of the transconductor;

a seventh transistor connected between the power supply and the first terminal of the first transistor, the seventh transistor having a gate connected to a first output terminal of the operation amplifier; and an eighth transistor connected between the power supply and the first terminal of the second transistor, the eighth transistor having a gate connected to a second output terminal of the operation amplifier.

13. The transconductor of claim 12, further comprising:
a first current amplification circuit mirroring current flowing in the first output terminal of the transconductor to generate a first output current; and a second current amplification circuit mirroring current flowing in the second output terminal of the transconductor to generate a second output current.

14. A method of reducing a direct current (DC) offset voltage occurring between a first and a second output terminal of a transconductor, the method comprising:
amplifying a difference between a first and a second input signal input to an input stage of a differential amplifier and outputting a first output voltage and a second output voltage to the first and second output terminals of the transconductor, respectively, wherein the differential amplifier amplifies the difference between the first input signal and the second input signal in response to a first and second control signal;

sensing the DC offset voltage between the first output voltage and the second output voltage output from the first and second output terminals of the transconductor and outputting a sensing result;

generating a feedback current in response to the sensing result and providing the feedback current to the input stage of the differential amplifier; and adjusting one of the first output voltage and the second output voltage in response to the feedback current to substantially cancel out the DC offset voltage.

15. A method of reducing a direct current (DC) offset voltage occurring between a pair of output terminals of a transconductor, the method comprising:
amplifying a difference between a first and a second input signal of an input stage of a differential amplifier;

outputting a first output voltage and a second output voltage to a pair of first output terminals of the differential amplifier;

outputting a first output current and a second output current obtained by mirroring currents flowing at the pair of first output terminals of the differential amplifier, a third output voltage generated based on the first output current, and a fourth output voltage generated based on the second output current, to a pair of second output terminals of the differential amplifier;

sensing a DC offset voltage between the third output voltage and the fourth output voltage and outputting a sensing result;

generating a feedback current in response to the sensing result and providing the feedback current to the input stage of the differential amplifier;

and adjusting one of the third output voltage and the fourth output voltage in response to the feedback current.

* * * * *